US008889036B2

(12) United States Patent
Simonetti et al.

(10) Patent No.: US 8,889,036 B2
(45) Date of Patent: Nov. 18, 2014

(54) SCINTILLATOR CRYSTAL MATERIALS, SCINTILLATORS AND RADIATION DETECTORS

(75) Inventors: John J. Simonetti, Hamilton, NJ (US); Donna Simonetti, legal representative, Hamilton, NJ (US); Albert Hort, Mount Laurel, NJ (US); Christian Stoller, Princeton Junction, NJ (US)

(73) Assignee: Schlumberger Technology Corporation, Sugar Land, TX (US)

( * ) Notice: Subject to any disclaimer, the term of this patent is extended or adjusted under 35 U.S.C. 154(b) by 321 days.

(21) Appl. No.: 13/319,709

(22) PCT Filed: May 11, 2010

(86) PCT No.: PCT/US2010/034431
§ 371 (c)(1),
(2), (4) Date: Apr. 12, 2012

(87) PCT Pub. No.: WO2010/132489
PCT Pub. Date: Nov. 18, 2010

(65) Prior Publication Data
US 2012/0186061 A1     Jul. 26, 2012

Related U.S. Application Data

(60) Provisional application No. 61/178,549, filed on May 15, 2009.

(51) Int. Cl.
C09K 11/85    (2006.01)
E21B 43/00    (2006.01)
G21K 4/00     (2006.01)
C09K 11/77    (2006.01)
G01V 5/12     (2006.01)
C30B 11/00    (2006.01)
C30B 15/00    (2006.01)
C30B 29/12    (2006.01)
G01T 1/202    (2006.01)

(52) U.S. Cl.
CPC .............. G21K 4/00 (2013.01); C09K 11/7772 (2013.01); G01V 5/12 (2013.01); C09K 11/7704 (2013.01); C30B 11/00 (2013.01); C30B 15/00 (2013.01); C30B 29/12 (2013.01); G01T 1/202 (2013.01); G21K 2004/06 (2013.01); C09K 11/7719 (2013.01)

USPC .................. 252/301.4 H; 117/940; 250/269.1

(58) Field of Classification Search
CPC ....... C09K 11/7772; G01V 5/12; G01T 1/202
USPC .................. 252/301.4 H; 117/940; 250/269.1
See application file for complete search history.

(56) References Cited

U.S. PATENT DOCUMENTS

| 4,360,733 | A  | 11/1982 | Novak et al. |
| 5,015,860 | A  | 5/1991  | Moses |
| 5,319,203 | A  | 6/1994  | Anderson et al. |
| 7,067,815 | B2 | 6/2006  | Dorenbos et al. |
| 7,067,816 | B2 | 6/2006  | Dorenbos et al. |
| 7,084,403 | B2 | 8/2006  | Srivastava et al. |
| 7,233,006 | B2 | 6/2007  | Dorenbos et al. |
| 7,405,404 | B1 | 7/2008  | Shah |
| 2005/0061982 | A1 | 3/2005 | Ichinose et al. |
| 2007/0001118 | A1 | 1/2007 | Srivastava et al. |
| 2008/0067391 | A1 | 3/2008 | Shimizu et al. |
| 2008/0131348 | A1 | 6/2008 | Srivastava et al. |
| 2010/0090111 | A1 | 4/2010 | Stoller et al. |

FOREIGN PATENT DOCUMENTS

| JP | 2006199727 A  |   | 8/2006 |
| JP | 2007-45869    | * | 2/2007 |
| JP | 2007045869 A  |   | 2/2007 |
| JP | 2008007393 A  |   | 1/2008 |
| JP | 2008013762 A  |   | 1/2008 |
| WO | 2009054946 A1 |   | 4/2009 |

OTHER PUBLICATIONS

Translation for JP 2007-045869: Feb. 22, 2007.*
International Preliminary Report on Patentability dated Nov. 24, 2011 for corresponding PCT Application No. PCT/US2010/034431 filed May 11, 2010.
Japanese Office Action for Japanese Application No. 2012-510954 dated Aug. 6, 2014.

* cited by examiner

*Primary Examiner* — Carol M Koslow
(74) *Attorney, Agent, or Firm* — Cathy Hewitt; Jeremy Berman

(57) ABSTRACT

The present disclosure describes a scintillation crystal having the general formula $RE_{(1-y)}M_yF_{3x}A_{3(1-x)}$, wherein RE includes; A is selected from Cl, Br or I; and M is an activator ion selected from the $Ce^{3+}$, $Pr^{3+}$ or $Eu^{3+}$; x is greater than 0.01 mole% and strictly less than 100 mole%, and y is greater than 0.01 mole% and strictly less than 100 mole%; and wherein the at least one activator ion is further combined with ions from the group of $Ho^{3+}$, $Er^{3+}$, $Tm^{3+}$, or $Yb^{3+}$.

5 Claims, 3 Drawing Sheets

SCINTILLATOR CRYSTAL MATERIALS, SCINTILLATORS AND RADIATION DETECTORS

RELATED APPLICATIONS

The present application claims priority to U.S. Provisional Patent Application Ser. No. 61/178,549 filed May 15, 2009.

BACKGROUND

The detection of radiation can be accomplished by a device known as a scintillation detector. This device is generally useful in such diverse fields as medical diagnostic methods and Industrial analysis, basic nuclear research and also nuclear well logging. In all cases, the primary component of a scintillation detector is a material that emits light after interaction with incident high energy radiation, in particular X-rays or Gamma ray photons. The material that exhibits light emission is typically a crystalline solid and preferably a monocrystalline solid that is referred to as a scintillation crystal.

Scintillation detectors have been used in well logging for many years. During the initial use of these scintillators for downhole applications several service companies resorted to the use of dewar flasks to limit the temperature seen by the scintillation detector and in particular by the photomultiplier (PMT) and the associated electronics. Schlumberger tools rated at temperatures up to 200° C. did not use such flasks due to the use of more advanced PMTs and electronics for NaI(TI) scintillation detectors. For scintillation materials such as BGO (Bismuth Germanate, $Bi_4Ge_3O_{12}$), it was necessary to resort to dewar flasks and large internal thermal mass to avoid excessive scintillator temperatures that, while not damaging the scintillator, led to unacceptable performance.

The recent advent of new scintillation materials with outstanding temperature performance has made it possible to make detectors capable of working at temperatures even beyond 200° C. if suitable photomultipliers or other devices for conversion of light to electrical signals are employed.

The new scintillators are described in several publications, patents and patent applications. Various patents for $LaBr_3$:Ce and $LaCl_3$:Ce are held by Saint Gobain (e.g. U.S. Pat. Nos. 7,067,815 and 7,233,006), and mixed La-halides are the subject of a patent assigned to General Electric Company (U.S. Pat. No. 7,084,403). There are also several oxide-based scintillators with excellent high temperature performance, which are not hygroscopic. These include LuAP:Ce, LuYAP:Ce, LuAG:Pr and LPS (Lutetium Pyro-Silicate, $Lu_2Si_2O_7$) to name a few.

The recent observation that some of the new materials, while capable to operate at very high temperature, will tend to crack or shatter as they are heated up or cooled down rapidly, necessitated a new kind of thermal protection, which is focused on an even temperature distribution around the scintillator and on reducing the rate at which the temperature increases without regard to protecting the scintillation detector from excessive temperatures.

The present invention intends to overcome this limitation through the use of new scintillation materials that are less prone to developing thermal stresses and more resistant to them.

SUMMARY

The present invention provides a new scintillation compound containing substantial amounts of fluorine.

Other or alternative features will become apparent from the following description, from the drawings, and from the claims.

DETAILED DESCRIPTION

Figure 1:
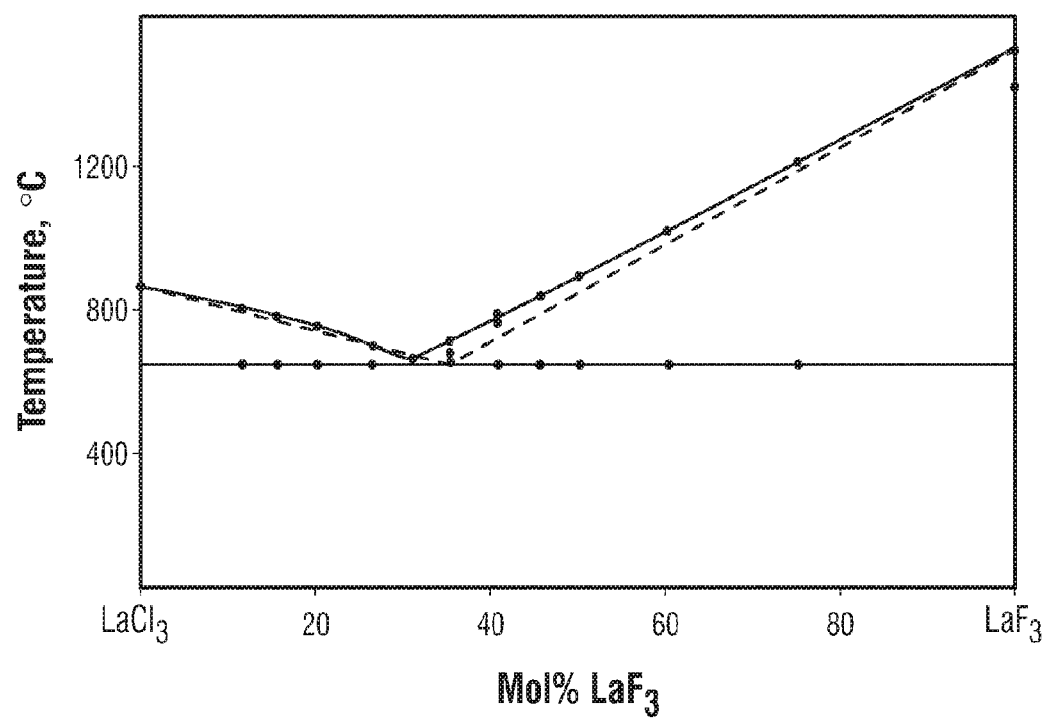
FIG. 1 is a phase diagram of a mixed halide combination of $LaCl_3$ and $LaF_3$.

In the following description, numerous details are set forth to provide an understanding of the present disclosure. However, it will be understood by those skilled in the art that the present invention may be practiced without these details and that numerous variations or modifications from the described embodiments are possible.

$LaBr_3$ and $LaCl_3$ doped with substantial concentrations of Ce show very good scintillator properties for many potential applications. The light yield and resolution are excellent and the decay time is short at 17 ns. However, these compounds have several properties that make them difficult to apply for the detection of radiation in the demanding environment encountered when logging wells. The unsatisfactory physical properties include: 1) Reactivity with water vapor and oxygen; 2) Sensitivity to fracturing from direct application of local mechanical stress; 3) Sensitivity to fracturing from stress resulting from thermal gradients; and 4) Crystal growth limited to the Bridgeman technique.

A new compound scintillator is provided that will have better resistance to degradation by humidity or exposure to air and at the same time exhibit improved general mechanical strength and resistance to damage that can result from the application of temperature gradients.

The new complex halide scintillator has the general formula $RE_{(1-y)}M_yF_xA_{(3-x)}$ where A represents a second halide species that may be either of the three elements Cl, Br or I. In one embodiment, the scintillator has the formula $La_{(1-y)}M_y$-$F_xA_{(3-x)}$ where A represents a second halide species that may be either of the three elements Cl, Br or I.

Since the pure lanthanum halide crystal is not expected to emit light in response to absorption of a gamma ray or X-ray photon an activator ion M must be added. M may be any rare earth activator ion, but is preferably Ce, Pr or Eu. In addition it may be advantageous to add heavier lanthanide elements that may include $Ho^{3+}$, $Er^{3+}$, $Tm^{3+}$, or $Yb^{3+}$. This latter group of ions can be applied in some cases to help prevent extended decay times due to traps. It is also possible that RE can be partially or fully $Gd^{3+}$, $Y^{3+}$ or $Lu^{3+}$, rather than La3+. $La^{3+}$ has a completely empty 4f orbital while $Gd^{+3}$ has a half filled orbital and $Lu^{3+}$ has a completely filled 4f shell. These electronic configurations have extra stability that precludes interference with the scintillation process. In the general formula $RE_{(1-y)}M_yF_3xA_{3(1-x)}$, x may be greater than 0.01 mole % and strictly less 100 mole %, and y may be greater than 0.01 mole % and strictly less than 100 mole %.

The formula above can be expanded to include mixed halides that include two or more halogens here designated as A and B, in addition to F. The formula becomes $RE_{(1-y)}M_yF_{3x}A_{3(1-x-z)}B_{3z}$. As in the more general formula above, RE can be La, Gd, Y or Lu, or combinations thereof. The potential problem of incorporating more than two halide ions is the increased potential for forming insoluble phases.

It has been discovered that large LaBr$_3$:Ce crystals, with diameters greater than 1", fracture when exposed to even moderate heating rates of 1° C./min. This has prompted the proposal of new material containing substantial amounts of Fluorine. The mixed halide proposed should provide an advantage since the presence of the Fluoride ion will induce internal stress that may reduce fracture propagation. At least one mixed halide combination of LaCl$_3$ and LaF$_3$ has a well behaved phase diagram that suggests the formation of a LaCl$_2$F compound. This compound may in fact have outstanding physical properties and at the same time also maintain high efficiency as a scintillation crystal when the activator ions noted here are added. The phase diagram is shown in FIG. 1.

In addition, the mixed halide scintillators may exhibit substantially improved physical properties compared to the single element halide compounds. One improved property may be fracture toughness, as the small F ion will present an ionic radius mismatch for substitution into sites normally occupied by either, Cl, Br or I. Also, addition of Fluorine may result in the decrease of the molar volume, and therefore, an increase in density. At the same time the thermal conductivity will improve. An improvement in thermal conductivity will reduce the sensitivity toward fracture development during rapid heating or cooling.

Typically, ionic salts may be most often crystallized from the melt using the Bridgeman method. However, single crystals of Fluoride salts may also be manufactured by the Czochralski technique, which presents some advantage in that Czochralski growth can produce single crystals with a controlled orientation and very low residual stress. The binary Lanthanum halide compounds are not suitable for growth by this method since they have an intrinsically low thermal conductivity. The addition of substantial amounts of Fluorine is expected to make Czochralski growth possible. During growth, we minimize or eliminate the presence of oxide impurities in the melt used for crystal growth by introducing reactive components that typically include halides or halocarbon compounds. These purifying compounds remove oxygen by displacement or scavenging. Some examples of typical compounds used for purification include $F_2$, $Cl_2$, $Br_2$, $CX_4$ where X=F, Cl, Br, I, or $NH_4Cl$, $NH_4F$, $NF_3$.

The phase diagram of FIG. 1 shows that many compositions of LaCl3 with LaF3 have a melting point that is considerably less than for the pure compounds. This represents an advantage for crystal growth since a lower melting point will reduce energy costs and allow for a simpler furnace design. In the case of the eutectic compound LaCl$_2$F, the melting temperature would be only 654° C.

An inorganic scintillation material of the form $CeF_xA_{(3-x-z)}B_z$ where the activator and the host are the same. One such inorganic scintillation material is of the form $CeF_xA_{(3-x)}$ where the activator and the host material are the same, wherein A is a halogen either Cl, Br or I, and where x is larger than 0.01 mol % and strictly smaller than 100 mol %, and where A and B are halogens either Cl, Br or I. In such general formula, z is between 0 and 3.

Figure 2:
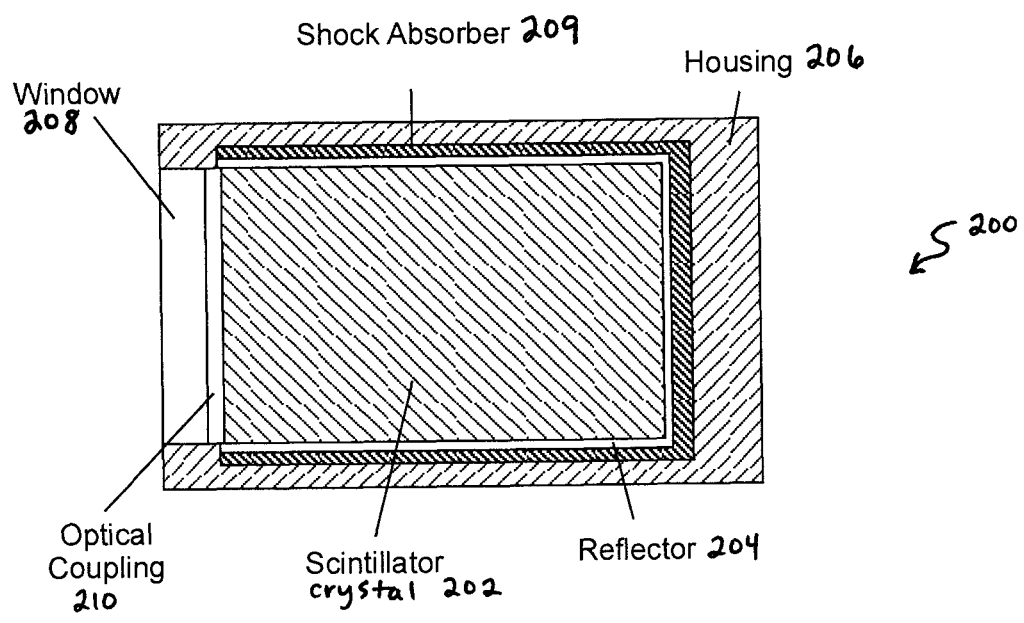
FIG. 2 shows a typical construction for an encapsulated scintillation crystal.

A typical scintillator crystal package 200 is assembled from the individual parts shown in FIG 2. A scintillator crystal 202 is wrapped or otherwise surrounded by one or more layers of a preferably diffuse reflector 204. The wrapped crystal 202 can be inserted in a hermetically sealed housing 206 which may already have the optical window 208 attached. The window 208 may be sapphire or glass, as noted in U.S. Pat. No. 4,360,733. The housing 206 may then be filled with a shock absorber 209, i.e., silicone (RTV) that fills the space between the scintillator crystal 202 and the inside diameter of the housing 206. Optical contact between the scintillator crystal 202 and the window 208 of the housing 206 is established using an internal optical coupling pad 210 comprising a transparent silicone rubber disk.

The scintillators described above are suitable for use at high temperatures and in an environment with large mechanical stresses. They can be combined with a suitable photodetection device to form a radiation detector. The photodetection devices can be photomultipliers (PMTs), position sensitive photomultipliers, photodiodes, avalanche photodiodes (APDs), photomultipliers based on microchannel plates (MCPs) for multiplication and a photocathode for the conversion of the photon pulse into an electron pulse. APDs are known to be useful in high temperature environments, and may be formed from silicon containing materials.

Given their properties, these detectors are particularly suited for use in downhole applications for the detection of gamma-rays in many of the instruments known in the art. The tools in which the detectors are used can be conveyed by any means of conveyance in the borehole, including without limitation, tools conveyed on wireline, drill strings, coiled tubing or any other downhole conveyance apparatus. A detector may alternatively include an avalanche photodiode (APD). An APD is typically a high-speed, high sensitivity photodiode utilizing an internal gain mechanism that functions by applying a reverse voltage. APDs are useful in high temperature environments, and may be formed from silicon containing materials.

Figure 3:
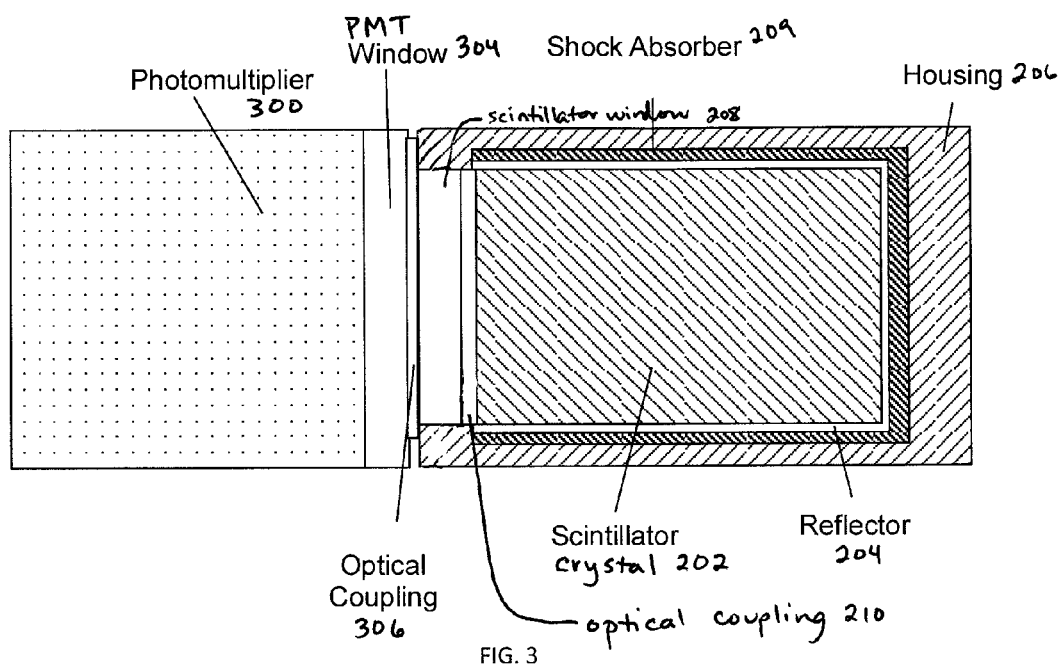
FIG. 3 shows a typical structure for a scintillation detector.

One typical scintillation detector type comprises a photomultiplier (PMT) 300 and a scintillation crystal 202 as shown in FIG. 3. The scintillation detector of FIG. 2 is coupled to the entrance window 304 of the PMT 300 by an optical coupling layer 306 to optimize the transmission of the light from the scintillator 202 (through the optical coupling 210 and the scintillator window 208) to the PMT 300. It should be noted that it is also possible to mount a scintillator directly to the PMT with only a single optical coupling (thereby eliminating optical coupling 210 and scintillator window 208) and providing the combination of PMT and scintillator into a single hermetically sealed housing. The scintillator crystal 202 may receive gamma rays such as from hydrocarbons in formations, and this energy may cause electrons in one or more activator ions in the scintillation material to rise to higher energy level. The electrons may then return to the lower or "ground" state, causing an emission of photon, typically in the ultraviolet. The photon is then converted in an electron in the photocathode of the PMT and the PMT amplifies the resulting electron signal.

While subterranean use is of particular interest, scintillators and scintillation detectors of the invention may be used in any field or industry where usage of such types of crystals and devices is known, including but not limited to chemistry, physics, space exploration, nuclear medicine, energy industry use, devices for determination of weights and measurements in any industry, and the like, without limitation.

The present invention is not to be limited in scope by the specific embodiments listed above. Indeed, various modifications of the present invention, in addition to those described herein, will be apparent to those skilled in the art from the foregoing description and drawings.

What is claimed is:

1. A scintillation crystal comprising the general formula $RE_{(1-y)}M_yF_3xA_{3(1-x)}$, wherein RE comprises La; wherein A is selected from Cl, Br or I, and M is at least one activator ion selected from $Ce^{3+}$, $Pr^{3+}$, or $Eu^{3+}$; wherein x is greater than 0.01 mole % and strictly less than 100 mole %, and y is greater than 0.01 mole % and strictly less than 100 mole %; and wherein the at least one activator ion is further combined with ions from the group of $Ho^{3+}$, $Er^{3+}$, $Tm^{3+}$, or $Yb^{3+}$.

2. The scintillation crystal according claim 1 wherein the crystal is grown using a Bridgeman process.

3. The scintillation crystal according claim 1 wherein the crystal is grown using a Czochralski process.

4. A method for oil exploration comprising optically coupling a photodetection device to a scintillation crystal to define a radiation detector, the scintillation crystal comprising the general formula $RE_{(1-y)}M_yF_3xA_{3(1-x)}$, wherein RE comprises La; wherein A is selected from Cl, Br or I, and M is at least one activator ion selected from $Ce^{3+}$, $Pr^{3+}$ or $Eu^{3+}$; wherein x is greater than 0.01 mole % and strictly less than 100 mole %, and y is greater than 0.01 mole % and strictly less than 100 mole %; and wherein the at least one activator ion is further combined with ions from the group of $Ho^{3+}$, $Er^{3+}$, $Tm^{3+}$, or $Yb^{3+}$.

5. The method according to claim 4, wherein the scintillation crystal comprises multiple activator ions M.

* * * * *